(12) United States Patent
Yang et al.

(10) Patent No.: US 11,659,297 B2
(45) Date of Patent: May 23, 2023

(54) IMAGE SENSOR WITH CHARGE PUMP CELL QUANTITY CONTROL

(71) Applicant: SHENZHEN GOODIX TECHNOLOGY CO., LTD., Shenzhen OT (CN)

(72) Inventors: Chao Yang, San Diego, CA (US); Dazhi Wei, San Diego, CA (US); Mohamed Elsayed, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 348 days.

(21) Appl. No.: 17/081,927

(22) Filed: Oct. 27, 2020

(65) Prior Publication Data
US 2022/0132060 A1     Apr. 28, 2022

(51) Int. Cl.
*H04N 25/709*     (2023.01)
*H02M 3/07*     (2006.01)
(Continued)

(52) U.S. Cl.
CPC ............ *H04N 25/709* (2023.01); *H02M 3/07* (2013.01); *H03M 1/12* (2013.01); *H04N 25/75* (2023.01)

(58) Field of Classification Search
CPC .......... H04N 5/37457; H04N 5/37452; H04N 5/35554; H04N 5/3535; H04N 5/3591;
(Continued)

(56) References Cited

U.S. PATENT DOCUMENTS 6,320,797 B1   11/2001   Liu
2007/0097741 A1   5/2007   Kang et al.
(Continued)

FOREIGN PATENT DOCUMENTS

| CN | 1959846 A | 5/2007 |
| CN | 107947567 A | 4/2018 |
| JP | 2004248475 A | 9/2004 |

OTHER PUBLICATIONS

State Intellectual Property Office of the People's Republic of China, first office Action Issued in Application No. 202111218969.2, dated Mar. 22, 2023, 8 pages.

*Primary Examiner* — Xi Wang
(74) *Attorney, Agent, or Firm* — Kilpatrick Townsend & Stockton LLP (57) ABSTRACT

An image sensor includes a plurality of image sensor cells, each configured to generate or not generate an image signal in response to one or more control signals, and a first driver generating a first control signal. The first driver includes a first positive supply terminal connected to a first power supply node. The image sensor also includes a voltage generator generating a first voltage at the first power supply node, where the voltage generator includes a plurality of charge pump cells selectably sourcing charge to the first power supply node in response to one of multiple enable signals, and a charge pump cell quantity controller circuit generating the enable signals. Each enable signal is either in an active or inactive state, and each charge pump cell sources charge to the first power supply node in response to receiving an enable signal in an active state.

18 Claims, 6 Drawing Sheets

(51) Int. Cl.
*H03M 1/12* (2006.01)
*H04N 25/75* (2023.01)

(58) Field of Classification Search
CPC .... H04N 5/363; H04N 5/23227; H04N 5/378; H04N 5/27455; H04N 5/357; H04N 5/3698; H01L 27/14654; H01L 27/14643; H01L 27/14641; H01L 27/14609; H03M 1/12
USPC ........................................................ 348/222.1
See application file for complete search history.

(56) References Cited

U.S. PATENT DOCUMENTS

| | | | |
|---|---|---|---|
| 2009/0251188 A1 | 10/2009 | Kim | |
| 2015/0131384 A1* | 5/2015 | Ogawa | G11C 16/30 365/185.2 |
| 2017/0013222 A1* | 1/2017 | Choi | H04N 5/3765 |
| 2020/0145599 A1* | 5/2020 | Matsuzaki | H04N 25/772 |

\* cited by examiner

Read mode

CNT EN

IMAGE SENSOR WITH CHARGE PUMP
CELL QUANTITY CONTROL

CROSS-REFERENCE TO RELATED
APPLICATIONS

This application is related to U.S. patent application Ser. No. 17/081,914, entitled "IMAGE SENSOR WITH DELAY LINE CHARGE PUMP VOLTAGE GENERATOR," filed herewith, and which is incorporated herein by reference for all purposes.

TECHNICAL FIELD

The subject matter described herein relates to charge pump voltage generators, and more particularly to charge pump voltage generators with multiple charge pump cells.

BACKGROUND

Image sensor power supply power efficiency and noise performance are affected by current load and voltage generator current generation capacity. For example, voltage generators consume an amount of power based on their current generation capacity, regardless of the amount of current provided to the load. Circuit techniques for improving power supply power efficiency and noise performance are needed in the art.

SUMMARY

One inventive aspect is an image sensor. The image sensor includes a plurality of image sensor cells, each configured to generate or not generate an image signal in response to one or more control signals, and a first driver configured to generate a first control signal. The first driver includes a first positive supply terminal connected to a first power supply node. The image sensor also includes a voltage generator configured to generate a first voltage at the first power supply node, where the voltage generator includes a plurality of charge pump cells, each configured to selectably source charge to the first power supply node in response to one of a plurality of enable signals, and a charge pump cell quantity controller circuit configured to generate the enable signals, where each enable signal is either in an active state or in an inactive state, and where each charge pump cell is configured to source charge to the first power supply node in response to receiving an enable signal in an active state.

In some embodiments, the charge pump cell quantity controller is configured to determine the number of charge pump cells which source charge to the first power supply node based on a difference between a first voltage at an output node of the charge pump cells and a reference voltage.

In some embodiments, the charge pump cell quantity controller is configured to increase the number of charge pump cells which source charge to the first power supply node in response to the first voltage at being less than the reference voltage.

In some embodiments, the charge pump cell quantity controller is configured to decrease the number of charge pump cells which source charge to the first power supply node in response to the first voltage at being greater than the reference voltage.

In some embodiments, the charge pump cell quantity controller is configured to maintain the number of charge pump cells which source charge to the first power supply node constant while the image sensor cells generate an image signal.

In some embodiments, the charge pump cell quantity controller is configured to change the number of charge pump cells which source charge to the first power supply node constant while the image sensor cells do not generate an image signal.

In some embodiments, the charge pump cell quantity controller includes an up/down counter configured to increase the number enable signals in the active state and decrease the number enable signals in the inactive state in response to the first voltage at being less than the reference voltage.

In some embodiments, the charge pump cell quantity controller includes an up/down counter configured to decrease the number enable signals in the active state and increase the number enable signals in the inactive state in response to the first voltage at being greater than the reference voltage.

In some embodiments, the image sensor also includes a second driver configured to generate a second control signal, where the second driver includes a second positive supply terminal connected to a second power supply node. The voltage generator is further configured to generate a second voltage at the second power supply node, and further includes a first voltage regulator circuit configured to receive a first amount of charge from the charge pump cells, and to provide the received first amount of charge to the first power supply node at the first voltage, and a second voltage regulator circuit configured to receive a second amount of charge from the charge pump cells, and to provide the received second amount of charge to the second power supply node at a second voltage.

In some embodiments, the first and second voltages are different.

Another inventive aspect is a method of using an image sensor. The method includes selectively generating or not generating an image signal in response to one or more control signals, and, with a first driver, generating a first control signal, where the first driver includes a first positive supply terminal connected to a first power supply node. The method also includes, with a voltage generator, generating a first voltage at the first power supply node, where the voltage generator includes a plurality of charge pump cells, each configured to selectably source charge to the first power supply node in response to one of a plurality of enable signals, and a charge pump cell quantity controller circuit to generate the enable signals, where each enable signal is either in an active state or in an inactive state, where each charge pump cell is configured to source charge to the first power supply node in response to receiving an enable signal in an active state.

In some embodiments, the method also includes, with the charge pump cell quantity controller, determining the number of charge pump cells which source charge to the first power supply node based on a difference between a first voltage at an output node of the charge pump cells and a reference voltage.

In some embodiments, the method also includes, with the charge pump cell quantity controller, increasing the number of charge pump cells which source charge to the first power supply node in response to the first voltage at being less than the reference voltage.

In some embodiments, the method also includes, with the charge pump cell quantity controller, decreasing the number of charge pump cells which source charge to the first power supply node in response to the first voltage at being greater than the reference voltage.

In some embodiments, the method also includes, with the charge pump cell quantity controller, maintaining the number of charge pump cells which source charge to the first power supply node constant while the image sensor cells generate an image signal.

In some embodiments, the method also includes, with the charge pump cell quantity controller, changing the number of charge pump cells which source charge to the first power supply node constant while the image sensor cells do not generate an image signal.

In some embodiments, the method also includes, with an up/down counter of the charge pump cell quantity controller, increasing the number enable signals in the active state and decrease the number enable signals in the inactive state in response to the first voltage at being less than the reference voltage.

In some embodiments, the method also includes, with an up/down counter of the charge pump cell quantity controller, decreasing the number enable signals in the active state and increase the number enable signals in the inactive state in response to the first voltage at being greater than the reference voltage.

In some embodiments, the method also includes, with a second driver, generating a second control signal, where the second driver includes a second positive supply terminal connected to a second power supply node, and, with the voltage generator, generating a second voltage at the second power supply node. The voltage generator further includes a first voltage regulator circuit configured to receive a first amount of charge from the charge pump cells, and to provide the received first amount of charge to the first power supply node at the first voltage, and a second voltage regulator circuit configured to receive a second amount of charge from the charge pump cells, and to provide the received second amount of charge to the second power supply node at a second voltage.

In some embodiments, the first and second voltages are different.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Figure 1:
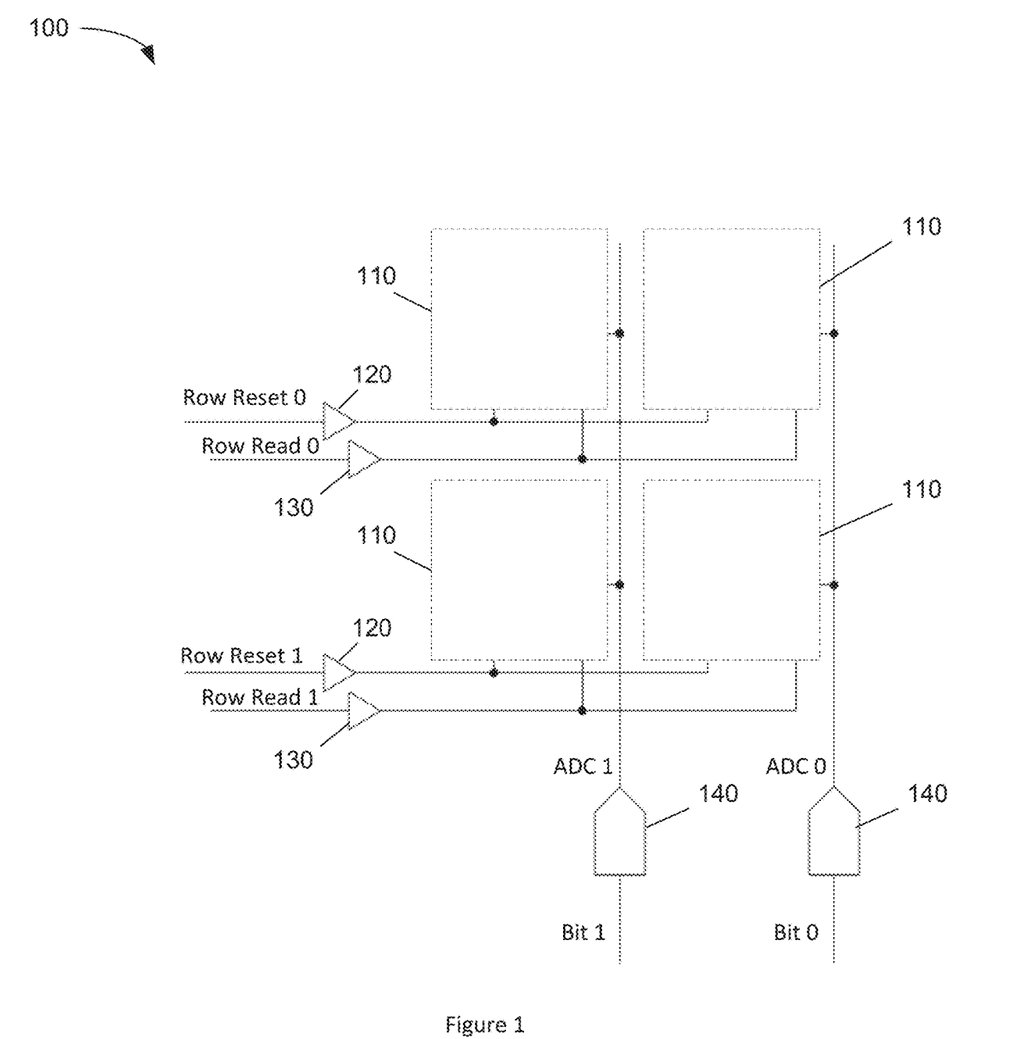
FIG. 1 is a schematic diagram of an embodiment of an image sensor array.
Figure 2:
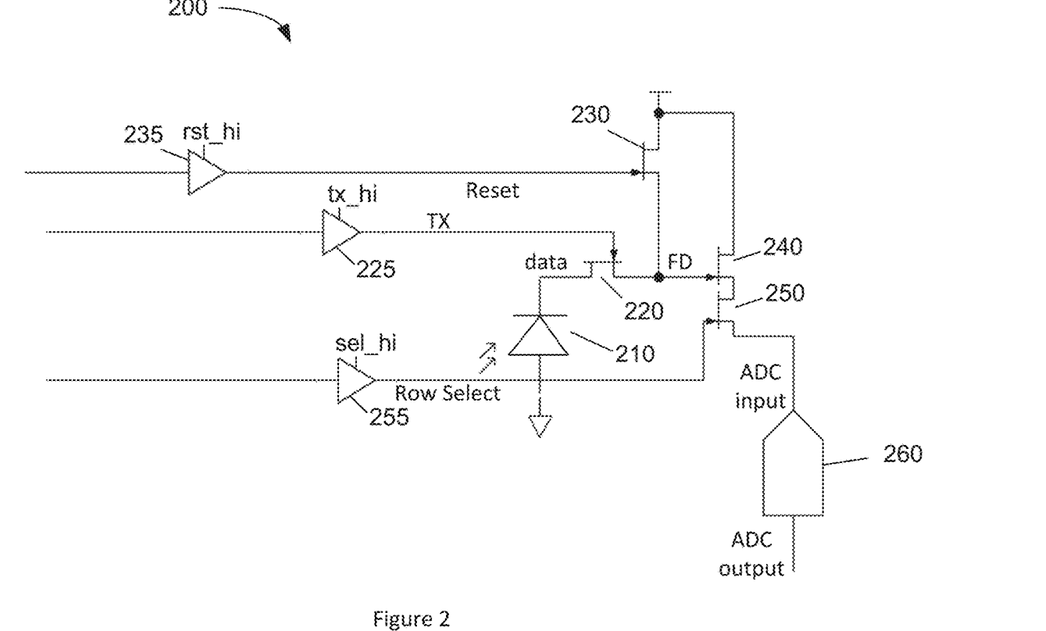
FIG. 2 is a schematic diagram of an embodiment of an image sensor array cell connected to peripheral circuitry.
Figure 3:
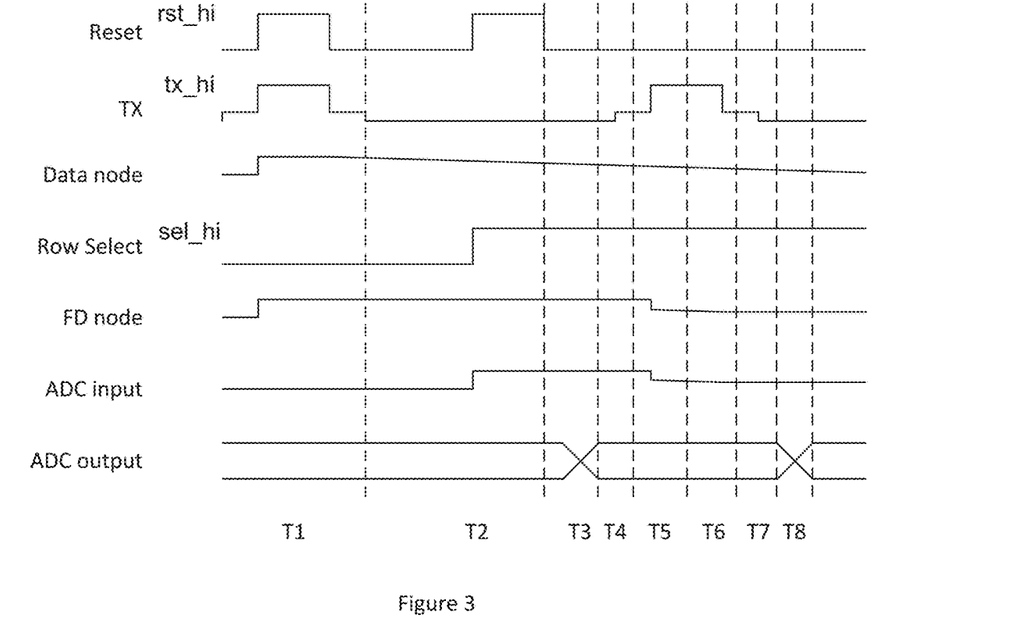
FIG. 3 is a timing diagram illustrating functionality of the image sensor array cell of FIG. 2.

Circuit features of image sensor circuits having power supplies voltage generators using charge pumps with a programmable number of charge pump cells are discussed with reference to the figures. FIG. 1 is a schematic diagram of an embodiment of an image sensor array. FIGS. 2-3 illustrate a sensor array cell and its operation. FIGS. 4-8 illustrate charge pump power supply generation systems having a programmable number of charge pump cells.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

FIG. 1 is a schematic diagram of an embodiment of an image sensor array 100.

Image sensor array 100 includes four image sensor cells 110, row reset buffers 120, row read buffers 130, and ADCs 140. Image sensor array 100 is an example only. Image sensor arrays having different features may alternatively be used.

Each of the image sensor cells 110 includes a photodiode, one or more switches configured to selectively receive signals from the row reset and row read buffers connected thereto. In response to the received signals, the switches cooperatively cause each of the image sensor cells 110 to accumulate charge with a storage capacitance according to an amount of light incident thereon, to deliver an image data signal to the one of the ADCs 140 based on the accumulated charge, to initialize the input of one of the ADCs 140, and to initialize the charge storage capacitance.

The ADCs 140 are configured to generate digital words corresponding with the analog voltage at their respective input nodes. Accordingly, the digital words generated by the ADCs correspond with and are a digital representation of the charge accumulated by the image sensor cells 110.

The charge stored in the image sensor cells 110 is a result of accumulated charge conducted by the respective photodiodes, as understood by those of skill in the art, between a time when the charge storage capacitance of image sensor cells 110 are initialized and a time when the image data signal is received by one of the ADCs 140.

The rows of image sensor cells 110 are successively read, and the digital words generated by the ADCs 140 are successively stored in a memory (not shown) to generate image data representing an image sensed by the entire sensor array 100, as understood by those of skill in the art. Furthermore, image data representing multiple images may be successively sensed by the sensor array 100, and stored in the memory.

FIG. 2 is a schematic diagram of an embodiment of an image sensor array cell 200 connected to peripheral circuitry. The image sensor array cell includes photodiode 210, Access transistor 220, reset transistor 230, source follower transistor 240, and ADC transistor 250. The peripheral circuitry includes ADC 260, reset driver 235, TX driver 225, and row select driver 255.

FIG. 3 is a timing diagram illustrating functionality of the image sensor array cell of FIG. 2.

During time T1, the data node of phototransistor 210 is reset. Time T1 may be considered a cell reset time, during which the data node of each of the image sensor array cells in a particular row of an image sensor is reset.

During time T1, reset driver 235 causes the reset node to be high (=rst_hi), and TX driver 225 causes the TX node to be high (=tx_hi). The voltage value of the high voltage at the TX node may, for example, be positive, and greater than a ground voltage. In addition, the row select driver 255 causes the row select node to be low. Because the row select node is low, ADC transistor 250 is not conductive, and the ADC input node is isolated from activity occurring within the image sensor array cell.

During time T1, in response to the reset node being high, reset transistor 230 is conductive. In addition, in response to the TX node being high, the access transistor 220 is conductive. Because the reset transistor 230 is conductive the voltage at node FD is equal to the voltage of the power supply node connected to the drain of reset transistor 230. In addition, because the access transistor 220 is conductive, the voltage at the data node of the phototransistor 210 is also equal to the power supply voltage (Vdd).

At the end of time T1, reset driver 235 causes the reset node to be low, and TX driver 225 causes the TX node to be low. The voltage value of the low voltage at the TX node may, for example, be negative, less than the ground voltage. In response to the reset node being low, reset transistor 230 is nonconductive, and in response to the TX node being low, access transistor is nonconductive. In some embodiments, at the end of time T1, reset driver 235 does not cause the reset node to be low, and reset transistor 230 remains conductive.

Because at least access transistor 220 is nonconductive, the data node of phototransistor 210 is no longer held at the power supply voltage. As understood by those of skill in the art, photodiode 210 conducts charge according to the light it receives. Accordingly, starting with the end of time T1, the voltage at the data node of phototransistor 210 is reduced by photodiode 210 according to the light received by photodiode 210.

During time T2, the ADC input node is reset. Time T2 may be considered an ADC reset or zero or initialization time, during which the ADC input nodes of the image sensor are reset or initialized or zeroed to a starting value as part of or in preparation for a read operation for reading data from the pixels of a particular row of the image sensor.

During time T2, the reset driver 235 causes the reset node to be or to remain high, and the row select driver 255 causes the row select node to be high (=sel_hi). In addition the TX driver 225 causes the TX node to be low. Because the TX node is low, access transistor 220 is not conductive, and the data node of the phototransistor 210 is isolated from activity occurring within the image sensor array cell.

During time T2, in response to the reset node being high, reset transistor 230 is conductive. In addition, in response to the row select node being high, the ADC transistor 250 is also conductive. Because the reset transistor 230 is conductive, the voltage at node FD is equal to the power supply voltage. Because the voltage at node FD is equal to the power supply voltage, source follower transistor 240 is conductive.

Because both source follower transistor 240 and ADC transistor 250 are conductive, source follower transistor 240 and ADC transistor 250 conduct charge from the power supply connected to the drain of source follower transistor 240 to the ADC input node. In response, the voltage at the ADC input node approaches a value equal to the power supply voltage minus a threshold voltage value Vt of source follower transistor 240, as understood by those of skill in the art.

In alternative embodiments, at the end of time T2, the reset driver 235 causes the reset node to become low, and the row select driver 255 causes the row select node to become low. In response to the reset node being low, reset transistor 230 becomes nonconductive. In some embodiments, the resent select node becomes low, and the ADC transistor 250 also becomes nonconductive. In some embodiments, at the end of time T2, row select driver 255 does not cause the row select node to be low, and ADC transistor 250 remains conductive.

In some embodiments, the pixel reset time of a particular row of the image sensor occurs during or near the time the ADC initialization time occurs as part of or in preparation for read operations, during which data from the pixels of another row of the image sensor is read.

During time T3, ADC 260 generates a first digital voltage D0 encoding the voltage at the ADC input node. Accordingly, first digital voltage D0 encodes the value Vdd−Vt.

During time T4, the TX driver 225 causes the voltage at the TX node to become equal to the ground voltage. In alternative embodiments, the TX driver 225 does not change the voltage at the TX node at time T4, such that the voltage at the TX node remains at the voltage value less than the ground voltage.

During time T5, the TX driver 225 causes the voltage at the TX node to become high, and the row select driver 255 either causes the row select node to become high or continues to cause the row select node to be high. In addition, the reset driver 235 causes the voltage at the reset node to remain low, such that the reset transistor 230 remains nonconductive.

In response to the voltage at the TX node becoming high, access transistor 220 becomes conductive. Because access transistor 220 is conductive and reset transistor 230 is nonconductive, the voltage at node FD becomes equal or substantially equal to the voltage (Vdata) at the data node of the phototransistor 210.

In addition, in response to the row select node being high, row select transistor 250 is or becomes conductive. Furthermore, because ADC transistor 250 is conductive, a current sink (not shown) connected to the ADC input node causes the voltages at the ADC input node and the source node of the source follower transistor 240 to drop. In some embodiments, the current sink is part of the ADC 260. In some embodiments, the current sink is not part of the ADC 260, but is connected elsewhere to the ADC input node.

As understood by those of skill in the art, the current sink causes the voltages at the ADC input node and the source node of the source follower transistor 242 drop to an image signal value equal to the voltage at the node FD minus a threshold voltage value Vt of source follower transistor 240.

Accordingly, during time T5, the voltage at the ADC input node becomes equal to Vdata−Vt.

During time T6, the TX driver 225 causes the voltage at the TX node to become equal to the ground voltage, and the row select driver 255 causes the row select node to become low.

In response to the voltage at the TX node becoming the ground voltage, access transistor 220 becomes nonconductive, and the data node becomes isolated from the node FD. In addition, in response to the voltage at the row select node becoming low, the ADC input node becomes isolated from the source follower transistor 240.

During time T7, the TX driver 225 causes the voltage at the TX node to become equal to the low voltage less than the ground voltage.

During time T8, ADC 260 generates a second digital voltage D1 encoding the voltage at the ADC input node. Accordingly, second digital voltage D1 encodes the value Vdata−Vt.

A controller, not shown, may receive both first and second digital voltages D0 and D1, and may determine the image data of the illustrated read operation as a difference between first and second digital voltages D0 and D1.

Figure 4:
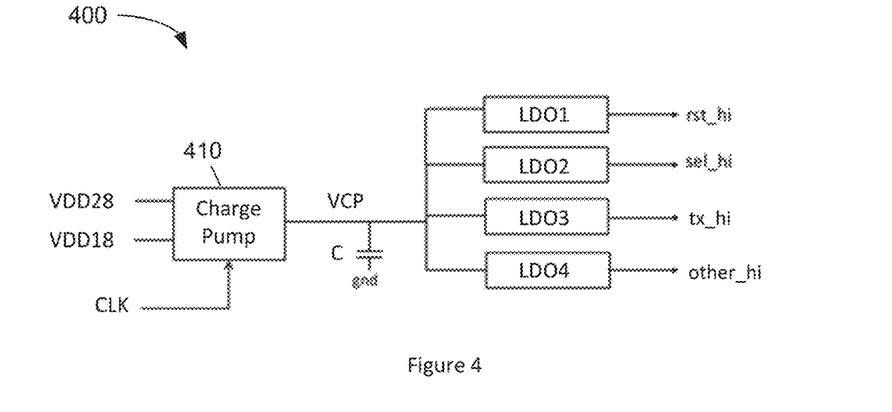
FIG. 4 is a schematic diagram of an embodiment of a charge pump power supply generation system.

FIG. 4 is a schematic diagram of an embodiment of a charge pump power supply voltage generator circuit 400. Power supply voltage generator circuit 400 includes charge pump 410, and low dropout voltage regulators LDO1, LDO2, LDO3, and LDO4. In some embodiments, other types of voltage regulators may be used instead of voltage regulators LDO1, LDO2, LDO3, and LDO4.

In this embodiment, charge pump 410 receives a first input voltage VDD28 having a voltage equal or substantially equal to 2.8 V and receives a second input voltage VDD18 having a voltage equal or substantially equal to 1.8 V. Charge pump 410 also receives a clock signal CLK.

Charge pump 410 generates an output voltage at node VCP. Based on the first and second input voltages VDD28 and VDD18 and based on the clock signal CLK. In this example embodiment, the output voltage at node VCP is equal or substantially equal to the sum of the first and second input voltages VDD28 and VDD18. Accordingly, in this example embodiment, the output voltage at node VCP is equal or substantially equal to 4.6 V.

In alternative embodiments, the first and second input voltages may have different voltages. In some embodiments, a charge pump receives a single input voltage, and generates an output voltage at node VCP based on the single input voltage. In some embodiments, a charge pump receives a more than two input voltages, and generates an output voltage at node VCP based on the received input voltages.

The output voltage at node VCP may have a ripple as a result of the operation of the charge pump circuitry. The ripple may, for example, have periodic voltage excursions which occur at a frequency related to a frequency of the clock signal CLK. For example may occur at the fundamental frequency of the clock signal CLK, the ripple voltage excursions or may occur at twice the fundamental frequency of the clock signal CLK, according to the functionality of the charge pump circuit, as understood by those of skill in the art. The magnitude of the voltage excursions is related to the relative capacitance of one or more charge pump capacitors in the charge pump circuit with respect to the capacitance at node VCP, as understood by those of skill in the art. Accordingly, the magnitude of the voltage excursions in the output voltage at node VCP may be reduced by increasing the capacitance of capacitor C, which is connected to an AC ground gnd.

Capacitor C may be any type of capacitor. For example, capacitor C may have first and second metal plates separated by an insulator. In some embodiments, capacitor C is formed using a transistor using techniques understood by those of skill in the art. For example, capacitor C may be an NMOS transistor having its drain and source connections shorted to a power supply node.

Each of low dropout voltage regulators LDO1, LDO2, LDO3, and LDO4 may generate a different output voltage, for example, based on a received reference voltage, as understood by those of skill in the art.

In the illustrated embodiment, low dropout voltage regulator LDO1 generates an output voltage rst_hi, which is used as a power supply by circuitry described below, low dropout voltage regulator LDO2 generates an output voltage sel_hi, which is used as a power supply by circuitry described below, low dropout voltage regulator LDO3 generates an output voltage tx_hi, which is used as a power supply by circuitry described below, and low dropout voltage regulator LDO1 generates an output voltage other_hi, which may be used as a power supply by other circuitry.

In some embodiments, one or more of the output voltages rst_hi, sel_hi, tx_hi, and other_hi has the same or substantially the same voltage as one or more other of the output voltages rst_hi, sel_hi, tx_hi, and other_hi. In some embodiments, one or more of the output voltages rst_hi, sel_hi, tx_hi, and other_hi has a different voltage as one or more other of the output voltages rst_hi, sel_hi, tx_hi, and other_hi.

The ripple in the output voltage at node VCP causes a corresponding ripple in each of the output voltages rst_hi, sel_hi, tx_hi, and other_hi. The circuits using output voltages rst_hi, sel_hi, tx_hi, and other_hi as power supplies each require an amount of current from the respective output voltage. The capacitance of the charge pump circuit 410 may be set so that charge pump circuit 410 provides adequate current to node VCP according to techniques known to those of skill in the art.

In addition, the circuits using output voltages rst_hi, sel_hi, tx_hi, and other_hi as power supplies may each tolerate an amount of power supply ripple. Accordingly, the capacitance of capacitor C may be set according to techniques known to those of skill in the art to reduce the ripple at the output voltage at node VCP so that the ripple at output voltages rst_hi, sel_hi, tx_hi, and other_hi is less than the tolerance of the circuits using output voltages rst_hi, sel_hi, tx_hi, and other_hi as power supplies.

Figure 5:
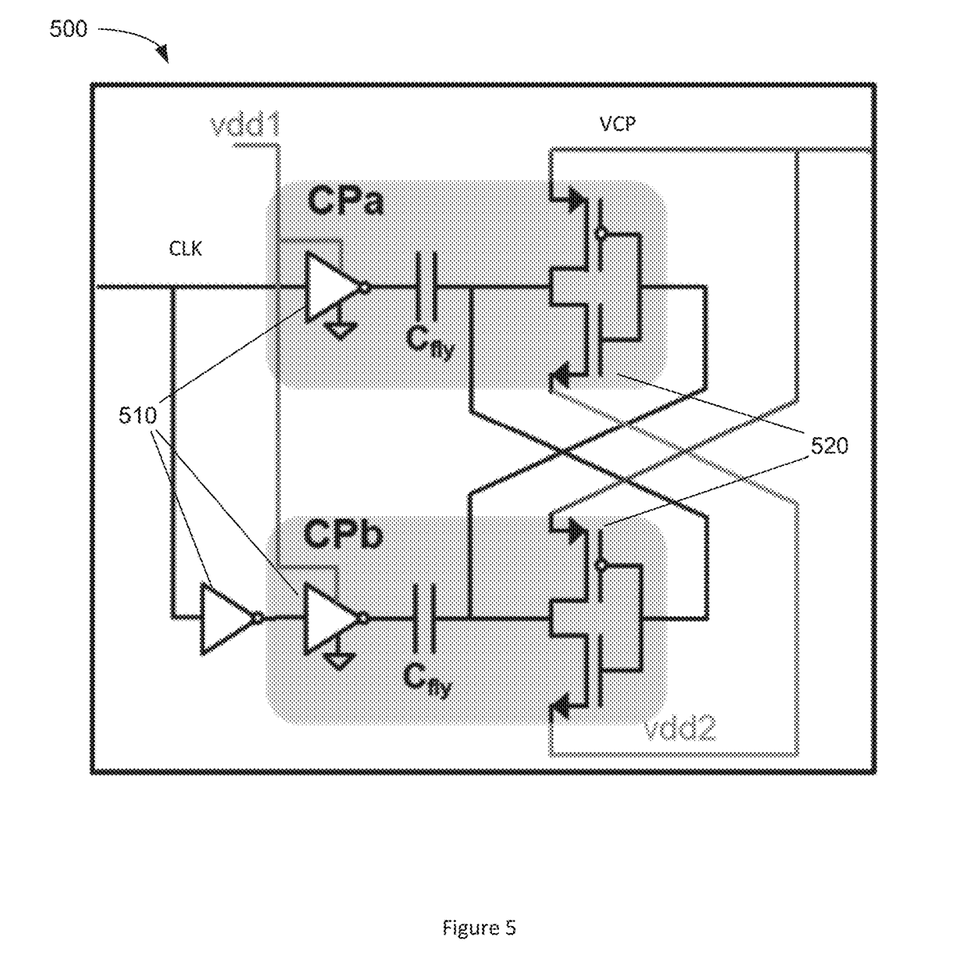
FIG. 5 is a schematic diagram of an embodiment of a charge pump cell.

FIG. 5 is a schematic diagram of an embodiment of a charge pump cell 500, which may be used in charge pump circuit 410. In some embodiments, charge pump circuit 410 uses other charge pump cells.

Charge pump cell 500 includes charge pump CPa and charge pump CPb.

Inverting buffers 510 receive clock signal CLK and generate out of phase clock signals for the capacitors Cfly of charge pumps CPa and CPb, where the voltage swing of the out of phase clock signals is equal to the voltage of the first voltage input vdd1. The out of phase clock signals are respectively coupled by the capacitors Cfly to the inputs of cross coupled inverters 520.

During times when the inputs of the cross coupled inverters 520 are high and greater than the voltage at the second voltage input vdd2 by at least a threshold voltage of the N devices of the cross coupled inverters 520, the outputs of the cross coupled inverters 520 are low and are equal to the voltage of the second voltage input vdd2.

Accordingly, the cross coupled inverters 520 because the low voltages at the outputs of cross coupled inverters to be equal or substantially equal to the voltage of the second voltage input vdd2. In addition, inverting buffers 510 and capacitors Cfly cause the voltage swing at the outputs of cross coupled inverters to be equal or substantially equal to the voltage of the first voltage input vdd1. Therefore, the peak voltage at the outputs of the cross coupled inverters 520 is equal to the sum of the voltages at the first and second voltage inputs vdd1 and vdd2.

Furthermore, while the inputs of cross coupled inverters are low in equal to the voltage of the first voltage input vdd1, the P devices of the cross coupled inverters 520 are conductive, such that charge pump cell 500 causes the voltage at output node VCP to be equal or substantially equal to the sum of the voltages at the first and second voltage inputs vdd1 and vdd2 by conducting current thereto.

Figure 6:
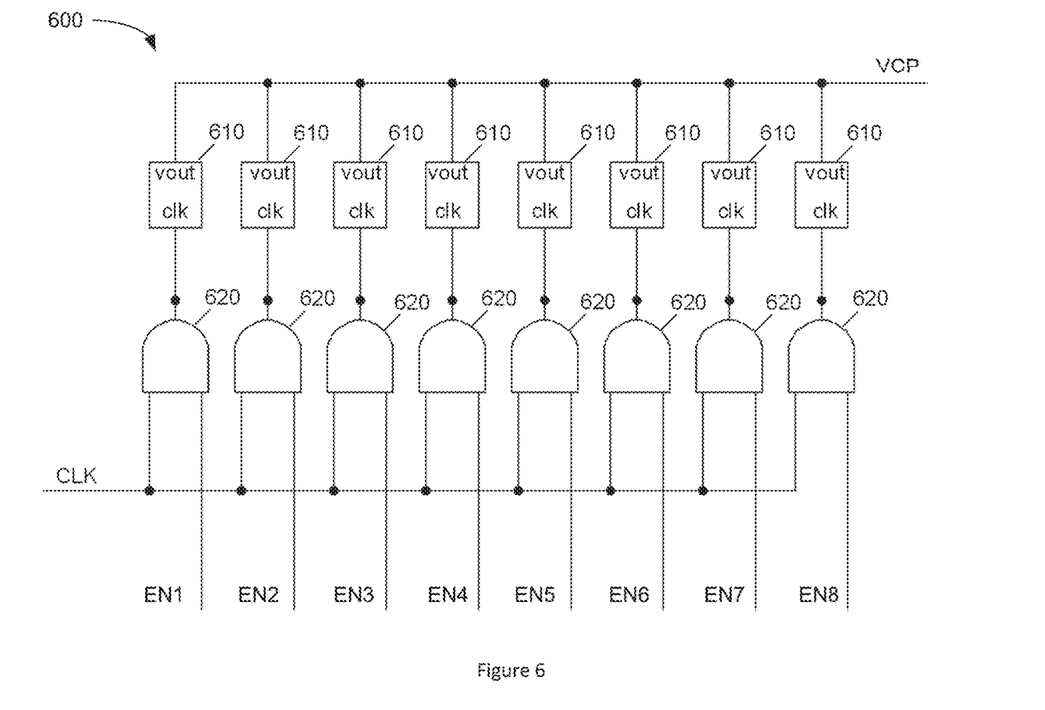
FIG. 6 is a schematic diagram of an embodiment of a charge pump voltage generator circuit using multiple charge pump cells.

FIG. 6 is a schematic diagram of an embodiment of a charge pump voltage generator circuit 600. Charge pump voltage generator circuit 600 may, for example, be used as charge pump circuit 410 of charge pump power supply voltage generator circuit 400. Charge pump voltage generator circuit 600 includes charge pump cells 610 and enable logic gates 620.

Enable logic gates 620 receive the clock signal at input CLK, and generate clock inputs for each of the charge pump cells 610 whose enable signal EN1-EN8 is active. In response to the clock inputs, each enabled charge pump cell 610 provides current to output node VCP, for example, according to principles similar or identical to those discussed above with reference to charge pump cell 500 and charge pump circuit 410.

In some embodiments, a delay between clock inputs for each of the charge pump cells 610 is implemented, for example, using techniques and principles similar or identical to those discussed in the related application entitled "IMAGE SENSOR WITH DELAY LINE CHARGE PUMP VOLTAGE GENERATOR," filed herewith.

Accordingly, each of the enabled charge pump cells 610 conducts current to output node VCP to generate a desired output voltage at output node VCP based on the received clock input and received one or more input voltages (not shown). As understood by those of skill in the art, the current sourcing capacity of each of the charge pump cells 610 depends on the capacitance of charge pump capacitors of the charge pump cells 610 and on the ability of the capacitor driving circuits of the charge pump cells 610.

Accordingly, the capacitance of the charge pump capacitors and the ability of the capacitor driving circuits of the charge pump cells 610 are designed so that the charge pump cells 610 collectively provide enough current to output node VCP to maintain the desired output voltage at output node VCP. Accordingly, each of the charge pump cells 610 is sized so as to provide only a portion current needed to maintain the desired output voltage at output node VCP. For example, each of the charge pump cells 610 may be sized so as to provide only 1/N of the current needed to maintain the desired output voltage at output node VCP, where N is the number of charge pump cells 610.

At least a portion of the current consumption of each of the charge pump cells 610 is independent of current delivered to output node VCP, and is dependent on the capacitance of the charge pump capacitors and the ability of the capacitor driving circuits of the charge pump cells 610.

In addition, as discussed above, the magnitude of the voltage excursions of the ripple caused by each of the charge pump cells 610 in the voltage at output node VCP is also dependent on the capacitance of the charge pump capacitors and the ability of the capacitor driving circuits of the charge pump cells 610.

Accordingly, the magnitude of the voltage excursions caused by charge pump voltage generator circuit 600 and the power consumption of charge pump voltage generator circuit 600 is dependent on the number of charge pump cells 610 which are enabled. In some embodiments, to minimize the magnitude of the voltage excursions in the power consumption, the number of charge pump cells 610 which are enabled is controlled, so that, for example, the number of enabled charge pump cells 610 is minimized while maintaining sufficient current generation capacity.

Accordingly, under less than maximum current load conditions, the number of charge pump cells 610 which are enabled is less than the maximum. Under the less than maximum current load conditions, the number of enabled charge pump cells 610 is reduced. The reduced number of enabled charge pump cells 610 collectively provide sufficient current to the load, however, because a number of charge pump cells 610 are not enabled, the magnitude of the voltage excursions caused by charge pump voltage generator 600 and the power consumption of charge pump voltage generator circuit 600 are reduced.

Figure 7:
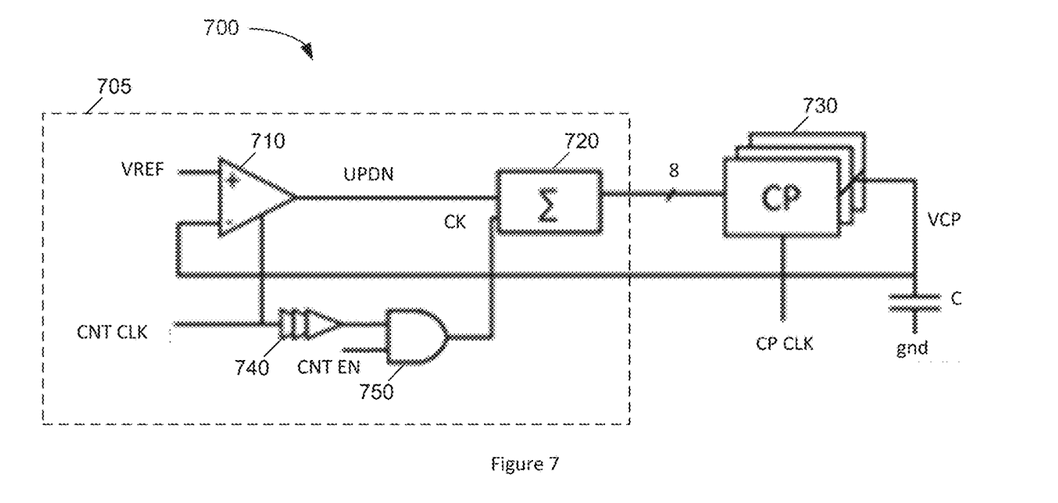
FIG. 7 is a schematic diagram of an embodiment of a charge pump cell quantity controller.

FIG. 7 is a schematic diagram of an embodiment of a charge pump voltage generator circuit 700 connected to capacitor C, which has features similar or identical to capacitor C illustrated in FIG. 4. Charge pump voltage generator circuit 700 may, for example, be used as charge pump circuit 410 of charge pump power supply voltage generator circuit 400.

Charge pump voltage generator circuit 700 is configured to control the number of enabled charge pump cells so that the total number of charge pump cells which are enabled is great enough to provide the current needed by the load.

Charge pump voltage generator circuit 700 includes charge pump cell circuit 730 and a charge pump cell quantity controller circuit 705. Charge pump cell quantity controller circuit 705 includes comparator 710, thermometer output counter 720, delay line 740, and logic gate 750. In some embodiments, alternative charge pump cell quantity controller circuits may be used.

Charge pump cell circuit 730 may have features and functionality similar or identical to charge pump voltage generator circuit 600. Charge pump cell circuit 730 receives a charge pump clock signal at node CP CLK. In addition, charge pump cell circuit 730 receives a number of enable signals, where the number of enable signals corresponds with the number of charge pump cells configured to be enabled or disabled within charge pump cell circuit 730. In the illustrated embodiment, charge pump cell circuit 730 receives eight enable signals, which corresponds with the number of charge pump cells in charge pump voltage generator circuit 600, of FIG. 6.

In response to the enable signals, a number of charge pump cells within charge pump cell circuit 730 are enabled, where the number of charge pump cells enabled corresponds with the number of enable signals that are in an active state, and the number of charge pump cells not enabled corresponds with the number of enable signals that are in an inactive state. In response to the charge pump clock signal, each enabled charge pump cell of charge pump cell circuit 730 provides current to output node VCP, for example, according to principles similar or identical to those discussed above with reference to charge pump cell 500 and charge pump circuit 410, and charge pump voltage generator 600.

Charge pump cell circuit 730 receives the enable signals from thermometer output counter 720, which determines the number of enable signals that are in the active state.

Thermometer output counter 720 comprises an up/down counter and increases the number of enable signals in the active state in response to receiving a clock signal at node CK and in response to receiving an up signal indication at node UPDN. In addition, thermometer output counter 720 decreases the number of enable signals in the active state in response to receiving a clock signal at node CK and in response to receiving a down signal indication at node UPDN.

Thermometer output counter 720 receives the up and down signals at node UPDN from comparator 710.

Comparator 710 generates an up signal or a down signal at node UPDN, for example, at each active edge of a clock signal received at node CNT CLK. To generate the up and down signals, comparator 710 compares the voltage at node VCP with a reference voltage at node VREF that is set to be equal, for example, to a target or acceptable voltage for that produced at node VCP. For example, comparator 710 may be configured to generate an up signal in response to an active edge of the received clock signal at node CNT CLK and in response to the voltage at node VCP being determined to be less than the reference voltage at node VREF. In addition, comparator 710 may be configured to generate a down signal in response to the active edge of the received clock signal at node CNT CLK and in response to the voltage at node VCP being determined to be greater than the reference voltage at node VREF.

In this embodiment, thermometer output counter 720 receives the clock signal at node CK from logic gate 750.

Logic gate 750 generates the clock signal at node CK based on a received count enable signal at node CNT EN and based on a clock signal received from delay circuit 740. While the enable signal at node CNT EN is in an active state, the clock signal received from delay circuit 740 is passed as the clock signal at node CK.

Accordingly, in response to the active edge in the clock signal received at node CNT CLK, comparator 710 generates an up signal or a down signal in response to a sign of the difference between the voltage at node VCP and the reference voltage at node VREF. In addition, if the enable signal at node CNT EN is in the active state, a delayed version of the clock signal at node CNT CLK is passed to thermometer output counter 720 at node CK. In response to an edge in the clock signal at node CK, thermometer output counter 720 either increases or decreases the number of enable signals in the active state for charge pump cell circuit 730. The delay caused by delay circuit 740 is sufficient to allow comparator 710 to generate a settled up or down signal before thermometer output counter 720 receives the edge and the clock signal at node CK.

Accordingly, while the enable signal at node CNT EN is in the active state, charge pump voltage generator circuit 700 adjusts the number of charge pump cells used to provide charge to node VCP based on the voltage at node VCP as sensed by comparator 710. In addition, while the enable signal at node CNT EN is not in the active state, charge pump voltage generator circuit 700 maintains the number of charge pump cells used to provide charge to node VCP.

A controller or a processor generates the enable signal at node CNT EN. In some embodiments, the frequency of the clock signal at node CNT CLK is less than the frequency of the charge pump clock signal at node CP CLK.

Figure 8:
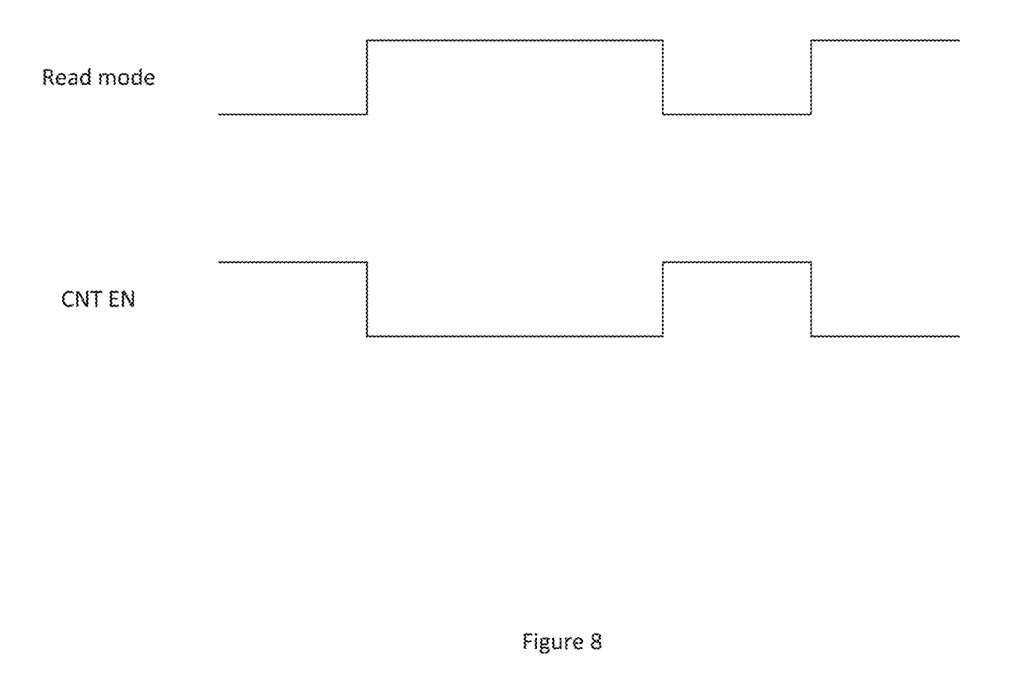
FIG. 8 is a waveform diagram illustrating timing of operation of an embodiment of a charge pump cell quantity controller.

FIG. 8 is a waveform diagram illustrating timing of operation of an embodiment of a charge pump voltage generator circuit with respect to read operations of an image sensor.

As discussed above, a charge pump voltage generator circuit, such as charge pump voltage generator circuit 700 may be used to generate power supply voltages for drivers, such as drivers 235, 225, and 255 of FIG. 2, which are used to conduct read operations of image sensor cells of an image sensor.

In some embodiments, changing the number of charge pump cells used to generate the voltage at node VCP causes undesirable noise in the voltage VCP. In such embodiments, the number of charge pump cells used to generate the voltage at node VCP may be changed during times when the drivers having power supply voltage is generated based on the voltage at node VCP are not used to conduct read operations. Similarly, read operations may be conducted during times when the number of charge pump cells used to generate the voltage at node VCP is not changed.

Charge pump voltage generator circuit 700 is configured to control the number of enabled charge pump cells so that the total number of charge pump cells which are enabled is great enough to provide the current needed by the load.

Charge pump voltage generator circuit 700 includes comparator 710, thermometer output counter 720, charge pump cell circuit 730, delay line 740, and logic gate 750.

As illustrated in FIG. 8, the enable signal at node CNT EN is active while read operations do not occur, and one or more read operations occur while the enable signal at node CNT EN is not active.

Figure 9:
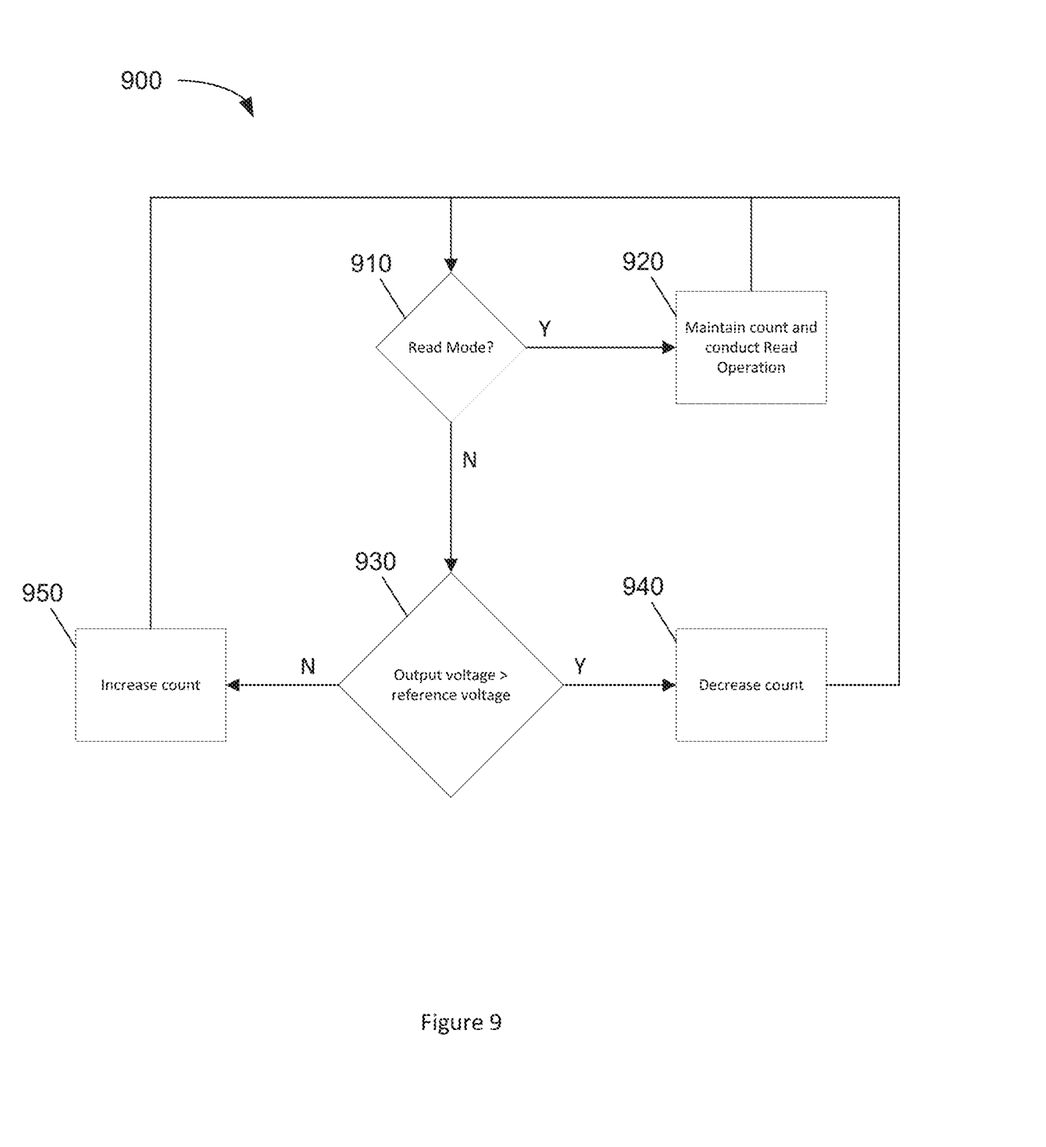
FIG. 9 is a flowchart diagram illustrating a method of operating of an image sensor circuit according to an embodiment.

FIG. 9 is a flowchart diagram illustrating a method 900 of operating of an image sensor circuit according to an embodiment.

At 900, a controller or a processor determines whether to conduct a read operation of the image sensor.

If the controller determines that a read operation is not to be conducted, at 930, the controller enables charge pump cell quantity adjustment functionality of a charge pump voltage generator, such as charge pump voltage generator circuit 700. In addition, at 930, the charge pump voltage generator determines whether the output voltage of the charge pump voltage generator is greater than a reference voltage.

If, at 930, the output voltage of the charge pump voltage generator is greater than the reference voltage, at 940, the charge pump voltage generator decreases the number of charge pump cells used to generate the output voltage of the charge pump voltage generator, and the method returns to 910.

If, at 930, the output voltage of the charge pump voltage generator is not greater than the reference voltage, at 950, the charge pump voltage generator increases the number of charge pump cells used to generate the output voltage of the charge pump voltage generator, and the method returns to 910.

If, at 910, the controller determines that a read operation is to be conducted, at 920, the controller causes the read operation to be performed, the controller disables charge pump cell quantity adjustment functionality of a charge pump voltage generator, such as charge pump voltage generator circuit 700. In addition, at 920, the controller causes one or more read operations to be performed while the charge pump voltage generator maintains the number of charge pump cells used to generate the output voltage of the charge pump voltage generator unchanged.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An image sensor, comprising:
a plurality of image sensor cells, each configured to generate or not generate an image signal in response to one or more control signals;
a first driver configured to generate a first control signal, wherein the first driver comprises a first positive supply terminal connected to a first power supply node; and
a voltage generator configured to generate a first voltage at the first power supply node, wherein the voltage generator comprises:
a plurality of charge pump cells, each configured to selectably source charge to the first power supply node in response to one of a plurality of enable signals, and
a charge pump cell quantity controller circuit configured to determine a number of the charge pump cells to source charge to the first power supply node based on a difference between a first voltage at an output node of the charge pump cells and a reference voltage, and to generate the enable signals based on the determined number of the charge pump cells, wherein each enable signal is either in an active state or in an inactive state,
wherein each charge pump cell is configured to source charge to the first power supply node in response to receiving an enable signal in an active state.

2. The image sensor of claim 1, wherein the charge pump cell quantity controller is configured to increase the number of charge pump cells which source charge to the first power supply node in response to the first voltage at being less than the reference voltage.

3. The image sensor of claim 1, wherein the charge pump cell quantity controller is configured to decrease the number of charge pump cells which source charge to the first power supply node in response to the first voltage at being greater than the reference voltage.

4. The image sensor of claim 1, wherein the charge pump cell quantity controller is configured to maintain the number of charge pump cells which source charge to the first power supply node constant while the image sensor cells generate an image signal.

5. The image sensor of claim 1, wherein the charge pump cell quantity controller is configured to change the number of charge pump cells which source charge to the first power supply node constant while the image sensor cells do not generate an image signal.

6. The image sensor of claim 1, wherein the charge pump cell quantity controller comprises an up/down counter configured to increase the number enable signals in the active state and decrease the number enable signals in the inactive state in response to the first voltage at being less than the reference voltage.

7. The image sensor of claim 1, wherein the charge pump cell quantity controller comprises an up/down counter configured to decrease the number enable signals in the active state and increase the number enable signals in the inactive state in response to the first voltage at being greater than the reference voltage.

8. The image sensor of claim 1, further comprising:
a second driver configured to generate a second control signal, wherein the second driver comprises a second positive supply terminal connected to a second power supply node,
wherein the voltage generator is further configured to generate a second voltage at the second power supply node, and further comprises:
a first voltage regulator circuit configured to receive a first amount of charge from the charge pump cells, and to provide the received first amount of charge to the first power supply node at the first voltage, and
a second voltage regulator circuit configured to receive a second amount of charge from the charge pump cells, and to provide the received second amount of charge to the second power supply node at a second voltage.

9. The image sensor of claim 8, wherein the first and second voltages are different.

10. A method of using an image sensor, the method comprising:
with each of a plurality of image sensor cells, selectively generating or not generating an image signal in response to one or more control signals;
with a first driver, generating a first control signal, wherein the first driver comprises a first positive supply terminal connected to a first power supply node;
with a voltage generator, generating a first voltage at the first power supply node, wherein the voltage generator comprises:
a plurality of charge pump cells, each configured to selectably source charge to the first power supply node in response to one of a plurality of enable signals, and
a charge pump cell quantity controller circuit configured to determine a number of the charge pump cells to source charge to the first power supply node based on a difference between a first voltage at an output node of the charge pump cells and a reference voltage, and to generate the enable signals based on the determined number of the charge pump cells, wherein each enable signal is either in an active state or in an inactive state, wherein each charge pump cell is configured to source charge to the first power supply node in response to receiving an enable signal in an active state.

11. The method of claim 10, further comprising, with the charge pump cell quantity controller, increasing the number of charge pump cells which source charge to the first power supply node in response to the first voltage at being less than the reference voltage.

12. The method of claim 10, further comprising, with the charge pump cell quantity controller, decreasing the number of charge pump cells which source charge to the first power supply node in response to the first voltage at being greater than the reference voltage.

13. The method of claim 10, further comprising, with the charge pump cell quantity controller, maintaining the number of charge pump cells which source charge to the first power supply node constant while the image sensor cells generate an image signal.

14. The method of claim 10, further comprising, with the charge pump cell quantity controller, changing the number of charge pump cells which source charge to the first power supply node constant while the image sensor cells do not generate an image signal.

15. The method of claim 10, further comprising, with an up/down counter of the charge pump cell quantity controller, increasing the number enable signals in the active state and decrease the number enable signals in the inactive state in response to the first voltage at being less than the reference voltage.

16. The method of claim 10, further comprising, with an up/down counter of the charge pump cell quantity controller, decreasing the number enable signals in the active state and increase the number enable signals in the inactive state in response to the first voltage at being greater than the reference voltage.

17. The method of claim 10, further comprising:

with a second driver, generating a second control signal, wherein the second driver comprises a second positive supply terminal connected to a second power supply node, and with the voltage generator, generating a second voltage at the second power supply node, wherein the voltage generator further comprises:

a first voltage regulator circuit configured to receive a first amount of charge from the charge pump cells, and to provide the received first amount of charge to the first power supply node at the first voltage, and a second voltage regulator circuit configured to receive a second amount of charge from the charge pump cells, and to provide the received second amount of charge to the second power supply node at a second voltage.

18. The method of claim 17, wherein the first and second voltages are different.

\* \* \* \* \*